(12) United States Patent
Seko et al.

(10) Patent No.: US 9,250,526 B2
(45) Date of Patent: Feb. 2, 2016

(54) COMPOSITION FOR FORMING RESIST UNDERLAYER FILM, AND PATTERN-FORMING METHOD

(71) Applicant: JSR CORPORATION, Tokyo (JP)

(72) Inventors: Tomoaki Seko, Tokyo (JP); Fumihiro Toyokawa, Tokyo (JP); Yuushi Matsumura, Tokyo (JP); Tooru Kimura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 100 days.

(21) Appl. No.: 13/785,466

(22) Filed: Mar. 5, 2013

(65) Prior Publication Data

US 2013/0233826 A1  Sep. 12, 2013

(30) Foreign Application Priority Data

Mar. 7, 2012  (JP) ................................. 2012-050953
Jan. 23, 2013  (JP) ................................. 2013-010011

(51) Int. Cl.
*G03F 7/09* (2006.01)
*G03F 7/11* (2006.01)
*G03F 7/075* (2006.01)

(52) U.S. Cl.
CPC ................ *G03F 7/11* (2013.01); *G03F 7/0752* (2013.01); *G03F 7/091* (2013.01); *G03F 7/094* (2013.01)

(58) Field of Classification Search
None
See application file for complete search history.

(56) References Cited

U.S. PATENT DOCUMENTS

| | | | |
|---|---|---|---|
| 2003/0138727 A1* | 7/2003 | Kawabe et al. | 430/270.1 |
| 2007/0107629 A1* | 5/2007 | Zheng et al. | 106/187.1 |
| 2008/0312400 A1* | 12/2008 | Yamashita et al. | 528/30 |
| 2009/0162782 A1* | 6/2009 | Takei et al. | 430/272.1 |
| 2009/0269697 A1* | 10/2009 | Kato et al. | 430/270.1 |
| 2009/0280438 A1* | 11/2009 | Kohno et al. | 430/323 |
| 2010/0291487 A1* | 11/2010 | Nakajima et al. | 430/313 |
| 2013/0137037 A1* | 5/2013 | Yamanaka et al. | 430/283.1 |
| 2013/0273330 A1* | 10/2013 | Wang et al. | 428/172 |

FOREIGN PATENT DOCUMENTS

| | | |
|---|---|---|
| JP | 06-12452 B | 5/1984 |
| JP | 59-93448 | 5/1984 |
| JP | 2004-310019 | 11/2004 |
| JP | 2005-018054 | 1/2005 |
| JP | 2010107932 A * | 5/2010 |

OTHER PUBLICATIONS

Machine translation JP 2010-107932. May 13, 2010.*
Ethyl Lactate Physical Constants Design Institute for Physical Properties, Sponsored by AIChE (2005; 2008; 2009; 2010; 2011; 2012).
DIPPR Project 801—Full Version. Design Institute for Physical Property Research/AIChE. Online version available at: http://app.knovel.com/hotlink/toc/id:kpDIPPRPF7/dippr-project-801-full/dippr-project-801-full.*

* cited by examiner

*Primary Examiner* — Cynthia H Kelly
*Assistant Examiner* — Alyssa L Cepluch
(74) *Attorney, Agent, or Firm* — Oblon, McClelland, Maier & Neustadt, L.L.P.

(57) ABSTRACT

A composition for forming a resist underlayer film includes a polysiloxane, and an organic solvent composition. The organic solvent composition includes an alkylene glycol monoalkyl ether acetate having a standard boiling point of less than 150.0° C., and an organic solvent having a standard boiling point of no less than 150.0° C. In the organic solvent composition, a content of the alkylene glycol monoalkyl ether acetate is no less than 50% by mass and no greater than 99% by mass, and a content of the organic solvent is no less than 1% by mass and no greater than 50% by mass.

12 Claims, No Drawings

COMPOSITION FOR FORMING RESIST UNDERLAYER FILM, AND PATTERN-FORMING METHOD

CROSS-REFERENCE TO RELATED APPLICATIONS

The present application claims priority under 35 U.S.C. §119 to Japanese Patent Application No. 2012-050953, filed Mar. 7, 2012 and to Japanese Patent Application No. 2013-010011, filed Jan. 23, 2013. The contents of these applications are incorporated herein by reference in their entirety.

BACKGROUND OF THE INVENTION

1. Field of the Invention

The present invention relates to a composition for forming a resist underlayer film, and a pattern-forming method.

2. Discussion of the Background

In manufacturing semiconductor devices, multilayer resist processes have been employed to meet miniaturization of patterns along with enhanced integration. In these processes, a composition for forming a resist underlayer film is first coated on a substrate to be processed to provide a resist underlayer film, and then a resist composition is coated on the resist underlayer film to provide a resist film. Thereafter, a resist film is exposed through a photomask by means of a stepping projection aligner (stepper) or the like, and developed with an appropriate developer solution to form a resist pattern. Subsequently, the resist underlayer film is dry-etched using the resist pattern as a mask, and the substrate to be processed is further dry-etched using the resultant resist underlayer film pattern as a mask, thereby enabling a desired pattern to be formed on the substrate to be processed.

As the composition for forming a resist underlayer film, which enables etching of the resist underlayer film for sure due to having a high etching selectivity with respect to a resist film, compositions containing a polysiloxane have been disclosed (see Japanese Unexamined Patent Application, Publication Nos. 2004-310019 and 2005-018054).

SUMMARY OF THE INVENTION

According to one aspect of the present invention, a composition for forming a resist underlayer film includes a polysiloxane, and an organic solvent composition. The organic solvent composition includes an alkylene glycol monoalkyl ether acetate having a standard boiling point of less than 150.0° C., and an organic solvent having a standard boiling point of no less than 150.0° C. In the organic solvent composition, a content of the alkylene glycol monoalkyl ether acetate is no less than 50% by mass and no greater than 99% by mass, and a content of the organic solvent is no less than 1% by mass and no greater than 50% by mass.

According to another aspect of the present invention, a pattern-forming method includes providing a resist underlayer film on a substrate using the composition. A resist film is provided on the resist underlayer film using a resist composition. The resist film is exposed by irradiation with an exposure light through a photomask. The exposed resist film is developed to form a resist pattern. The resist underlayer film and the substrate are sequentially dry-etched using the resist pattern as a mask.

DESCRIPTION OF THE EMBODIMENTS

According to one aspect of the embodiment of the present invention, a composition for forming a resist underlayer film includes: (A) a polysiloxane; and (B) an organic solvent composition, wherein the organic solvent composition (B) includes (B1) an alkylene glycol monoalkyl ether acetate having a standard boiling point of less than 150.0° C. (hereinafter, may be also referred to as "alkylene glycol monoalkyl ether acetate (B1)") and (B2) an organic solvent having a standard boiling point of no less than 150.0° C. (hereinafter, may be also referred to as "organic solvent (B2)"), and wherein in the organic solvent composition (B), the content of the alkylene glycol monoalkyl ether acetate (B1) is no less than 50% by mass and no greater than 99% by mass, and the content of the organic solvent (B2) is no less than 1% by mass and no greater than 50% by mass.

The composition for forming a resist underlayer film according to the embodiment of the present invention has superior storage stability by which alteration of the film thickness of the resist underlayer film while storing the composition can be decreased, and can reduce coating defects during a process for forming the resist underlayer film since the organic solvent composition (B) includes the specific alkylene glycol monoalkyl ether acetate (B1) and the organic solvent (B2) that is a component having a high boiling point.

The standard boiling point of the organic solvent (B2) is preferably no less than 180° C. When the standard boiling point of the organic solvent (B2) falls within the specified range, further improvement of the storage stability the composition is enabled, and the coating defects can be further reduced.

The organic solvent (B2) is preferably an ester, an ether or a combination thereof. When the organic solvent (B2) is the solvent thus specified, solubility of the polysiloxane (A) can be improved, and as a result, coating defects can be further reduced.

The organic solvent (B2) is preferably a carboxylate ester, a lactone, a carbonate, a compound represented by the following formula (1) or a combination thereof:

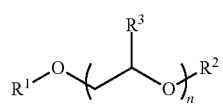

(1)

in the formula (1), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, wherein in a case where n is 2 or greater, a plurality of $R^3$s are optionally the same or different.

When the organic solvent (B2) is the solvent thus specified, the composition can further improve the solubility of the polysiloxane (A).

The relative permittivity of the organic solvent (B2) is preferably 13 or greater and 200 or less. When the relative permittivity of the organic solvent (B2) falls within the specified range, the composition can further improve the solubility of the polysiloxane (A).

The alkylene glycol monoalkyl ether acetate (B1) is preferably a propylene glycol monoalkyl ether acetate. When the alkylene glycol monoalkyl ether acetate (B1) is a propylene glycol monoalkyl ether acetate, the solubility of the polysiloxane (A) can be further improved.

The composition for forming a resist underlayer film can be suitably used for multilayer resist processes and can provide a resist underlayer film that generates less coating defects since the composition has the properties described above.

It is preferred that the composition for forming a resist underlayer film further includes (C) an acid diffusion control agent. When the composition for forming a resist underlayer film further contains the acid diffusion control agent (C), diffusion of an acid in the resist film which may be caused via the resist underlayer film can be effectively inhibited while maintaining the effects described above. As a result, the shape of a resist pattern formed by a multilayer resist process can be improved.

The polysiloxane (A) is preferably a hydrolytic condensate of a compound that includes a silane compound represented by the following formula (i):

$$R^A_a SiX_{4-a} \qquad (i)$$

in the formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms of the alkyl group are not substituted or optionally substituted by an epoxyalkyloxy group, an epoxy group, an acid anhydride group or a cyano group, and a part or all of hydrogen atoms of the aryl group are not substituted or optionally substituted by a hydroxy group; X represents a halogen atom or —$OR^B$, wherein $R^B$ represents a monovalent organic group; a is an integer of 0 to 3, wherein in a case where $R^A$ and X are each present in a plurality of number, each of a plurality of $R^A$s and a plurality of Xs are optionally the same or different.

When the polysiloxane (A) is a hydrolytic condensate of the specified compound, the composition can form a resist pattern having a favorable shape and can improve adhesiveness between the resist underlayer film and the resist film.

Another aspect of the embodiment of the present invention provides a pattern-forming method that includes:

(1) providing a resist underlayer film on a substrate using the composition for forming a resist underlayer film;

(2) providing a resist film on the resist underlayer film using a resist composition;

(3) exposing the resist film by irradiation with an exposure light through a photomask;

(4) developing the exposed resist film to form a resist pattern; and (5) sequentially dry-etching the resist underlayer film and the substrate using the resist pattern as a mask.

Since the composition for forming a resist underlayer film has the properties described above, a resist pattern having a favorable shape can be formed according to the pattern-forming method of the embodiment of the present invention.

The "standard boiling point" (hereinafter, may also be merely referred to as "boiling point") as referred to herein means a boiling point at 1 atm. In addition, the "relative permittivity" means the ratio of the dielectric constant of a medium to the dielectric constant of a vacuum. With respect to the relative permittivity of a compound, a value described in "Chemical Handbook: Basic Edition; Revised 5th Edition", etc., may be referred to. As the relative permittivity of a compound not described in the Chemical Handbook, a value obtained by determining at 20° C. by a method described in JIS C2138 may be referred to. In addition, the "monovalent organic group" as referred to herein means a monovalent group that includes at least one carbon atom.

As described in the foregoing, the composition for forming a resist underlayer film of the embodiment of the present invention has superior storage stability and can reduce generation of coating defects. Therefore, the composition for forming a resist underlayer film and the pattern-forming method can be suitably used in manufacturing processes of semiconductor devices in which miniaturization of patterns has been in progress. The embodiments will now be described in detail.

Composition for Forming a Resist Underlayer Film

The composition for forming a resist underlayer film of the embodiment of the present invention contains (A) a polysiloxane and (B) an organic solvent composition. In addition, the composition for forming a resist underlayer film may contain (C) an acid diffusion control agent as a suitable component. Furthermore, the composition for forming a resist underlayer film may contain other optional component as long as it does not impair the effects of the present invention.

It is to be noted that since the composition for forming a resist underlayer film is superior in a feature of improving coating defects, it can be suitably used in a multilayer resist process demonstrated in connection with the pattern-forming method described later, etc., and can form a resist underlayer film having fewer coating defects. Hereinafter, each component will be explained in detail.

(A) Polysiloxane

The polysiloxane (A) is not particularly limited as long as it is a polymer having a siloxane bond, and is preferably a hydrolytic condensate of a compound that includes the silane compound represented by the formula (i). The term "hydrolytic condensate of a compound that includes a silane compound" as referred to herein means a hydrolytic condensate of the silane compound represented by the formula (i), or a hydrolytic condensate of the silane compound represented by the formula (i) with a silane compound other than the silane compound represented by the formula (i) (hereinafter, may also be referred to as "other silane compound"). The other silane compound is not particularly limited as long as it is generates a silanol group via hydrolysis. When the polysiloxane (A) is a hydrolytic condensate of the compound represented by the above formula (i), the composition can form a resist pattern having a favorable shape and can improve adhesiveness between the resist underlayer film and the resist film.

In the above formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms of the alkyl group are not substituted or optionally substituted by an epoxyalkyloxy group, an epoxy group, an acid anhydride group or a cyano group, and a part or all of hydrogen atoms of the aryl group are not substituted or optionally substituted by a hydroxy group; X represents a halogen atom or —$OR^B$, wherein $R^B$ represents a monovalent organic group; a is an integer of 0 to 3, wherein in a case where $R^A$ and X are each present in a plurality of number, each of a plurality of $R^A$s and a plurality of Xs are optionally the same or different.

Examples of the alkyl group having 1 to 5 carbon atoms represented by the $R^A$ include linear alkyl groups such as a methyl group, an ethyl group, a n-propyl group, a n-butyl group and a n-pentyl group; branched alkyl groups such as an isopropyl group, an isobutyl group, a sec-butyl group, a t-butyl group and an isoamyl group, and the like. Of these, a methyl group and an ethyl group are preferred, and a methyl group is more preferred.

Examples of the alkenyl group having 2 to 10 carbon atoms represented by the $R^A$ include an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like.

Examples of the aryl group having 6 to 20 carbon atoms represented by the $R^A$ include a phenyl group, a naphthyl group, a methylphenyl group, an ethylphenyl group, a chlorophenyl group, a bromophenyl group, a fluorophenyl group, and the like.

It is to be noted that the "epoxy" as referred to herein includes both oxiranyl and oxetanyl.

Examples of the alkyl group substituted with an epoxyalkyloxy group include oxiranyloxyalkyl groups such as a 2-glycidyloxyethyl group, a 3-glycidyloxypropyl group and a 4-glycidyloxybutyl group; oxetanyloxyalkyl groups such as a 3-ethyl-3-oxetanyloxypropyl group, a 3-methyl-3-oxetanyloxypropyl group, a 3-ethyl-2-oxetanyloxypropyl group and a 2-oxetanyloxyethyl group, and the like. Of these, a 3-glycidyloxypropyl group and a 3-ethyl-3-oxetanyloxypropyl group are preferred.

The alkyl group substituted with an epoxy group is preferably an epoxyalkyl group having 2 to 10 carbon atoms, and is exemplified by a 1,2-epoxyethyl group, a 1,2-epoxypropyl group, a 1,2-epoxybutyl group, a 1,2-epoxypentyl group, and the like.

Examples of the alkyl group substituted with an acid anhydride group include a 2-succinic anhydride group-substituted ethyl group, a 3-succinic anhydride group-substituted propyl group, a 4-succinic anhydride group-substituted butyl group, and the like. Of these, a 3-succinic anhydride group-substituted propyl group is more preferred.

Examples of the alkyl group substituted with a cyano group include a 2-cyanoethyl group, a 3-cyanopropyl group, a 4-cyanobutyl group, and the like.

Examples of the aryl group substituted with a hydroxy group include a 4-hydroxyphenyl group, a 4-hydroxy-2-methylphenyl group, a 4-hydroxynaphthyl group, and the like. Of these, a 4-hydroxyphenyl group is more preferred.

Examples of the halogen atom represented by X include a fluorine atom, a chlorine atom, a bromine atom, an iodine atom, and the like.

As the monovalent organic group in the $R^B$, an alkyl group and an alkylcarbonyl group are preferred. The alkyl group is more preferably a methyl group, an ethyl group, a n-propyl group, an isopropyl group, a n-butyl group, a isobutyl group, a sec-butyl group or a t-butyl group, still more preferably a methyl group or an ethyl group, and particularly preferably a methyl group. In addition, as the alkylcarbonyl group, a methylcarbonyl group and an ethylcarbonyl group are more preferred.

Examples of the silane compound represented by the formula (i) include:

aromatic ring-containing trialkoxysilanes such as phenyltrimethoxysilane, 4-methylphenyltrimethoxysilane, 4-ethylphenyltrimethoxysilane, 4-hydroxyphenyltrimethoxysilane, 3-methylphenyltrimethoxysilane, 3-ethylphenyltrimethoxysilane, 3-hydroxyphenyltrimethoxysilane, 2-methylphenyltrimethoxysilane, 2-ethylphenyltrimethoxysilane, 2-hydroxyphenyltrimethoxysilane and 2,4,6-trimethylphenyltrimethoxysilane;

alkyltrialkoxysilanes such as methyltrimethoxysilane, methyltriethoxysilane, methyltri-n-propoxysilane, methyltri-iso-propoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-t-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-sec-butoxysilane, iso-propyltri-t-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltri-iso-propoxysilane, 2-methylpropyltri-n-butoxysilane, 2-methylpropyltri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltri-iso-propoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-t-butoxysilane, t-butyltriphenoxysilane, t-butyltrichlorosilane and t-butyldichlorosilane;

alkenyltrialkoxysilanes such as vinyltrimethoxysilane, vinyltriethoxysilane, vinyltri-n-propoxysilane, vinyltriiso-propoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane and allyltriphenoxysilane;

tetraalkoxysilanes such as tetramethoxysilane, tetraethoxysilane, tetra-n-propoxysilane, tetra-iso-propoxysilane, tetra-n-butoxysilane, tetra-sec-butoxysilane and tetra-t-butoxysilane;

tetraarylsilanes such as tetraphenoxysilane;

epoxy group-containing silanes such as 3-oxetanylmethyloxypropyltrimethoxysilane, 3-oxetanylethyloxypropyltrimethoxysilane and 3-glycidyloxypropyltrimethoxysilane;

acid anhydride group-containing silanes such as 3-(trimethoxysilyl)propylsuccinic anhydride, 2-(trimethoxysilyl)ethylsuccinic anhydride, 3-(trimethoxysilyl)propylmaleic anhydride and 2-(trimethoxysilyl)ethylglutaric anhydride;

tetrahalosilanes such as tetrachlorosilane; and the like.

Examples of the other silane compound include benzyltrimethoxysilane, phenethyltrimethoxysilane, 4-phenoxyphenyltrimethoxysilane, 4-aminophenyltrimethoxysilane, 4-dimethylaminophenyltrimethoxysilane, 4-acetylaminophenyltrimethoxysilane, 3-methoxyphenyltrimethoxysilane, 3-phenoxyphenyltrimethoxysilane, 3-aminophenyltrimethoxysilane, 3-dimethylaminophenyltrimethoxysilane, 3-acetylaminophenyltrimethoxysilane, 2-methoxyphenyltrimethoxysilane, 2-phenoxyphenyltrimethoxysilane, 2-aminophenyltrimethoxysilane, 2-dimethylaminophenyltrimethoxysilane, 2-acetylaminophenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, 4-acetylaminobenzyltrimethoxysilane, and the like.

Conditions for permitting the hydrolytic condensation are not particularly limited as long as at least a part of the silane compound represented by the above formula (i) is hydrolyzed to convert the hydrolyzable group (—OR$^B$) into a silanol group, thereby causing a condensation reaction, and the hydrolytic condensation may be carried out as follows, for example.

The water used for the hydrolytic condensation is preferably purified by a procedure such as a treatment with a reverse osmosis membrane, an ion-exchanging treatment or distillation. When such purified water is used, side reactions can be inhibited, thereby enabling a reactivity of the hydrolysis to be improved. The amount of the water used relative to 1 mol of the total amount of hydrolyzable groups of the silane compound represented by the above formula (i) is preferably 0.1 to 3 mol, more preferably 0.3 to 2 mol, and further preferably 0.5 to 1.5 mol. Use of the water in such an amount enables the reaction rate of the hydrolysis and condensation to be optimized.

The solvent which may be used for the hydrolytic condensation is not particularly limited, and is preferably ethylene glycol monoalkyl ether acetate, diethylene glycol dialkyl ether, propylene glycol monoalkyl ether, propylene glycol monoalkyl ether acetate, and propionic acid esters. Among these, diethylene glycol dimethyl ether, diethylene glycol ethyl methyl ether, propylene glycol monomethyl ether, propylene glycol monoethyl ether, propylene glycol monomethyl ether acetate, methyl 3-methoxypropionate, and 4-hydroxy-4-methyl-2-pentanone (diacetone alcohol) are more preferred.

The hydrolytic condensation reaction is preferably carried out in the presence of a catalyst such as a catalyst of an acid (for example, hydrochloric acid, sulfuric acid, nitric acid, formic acid, oxalic acid, acetic acid, trifluoroacetic acid, trifluoromethanesulfonic acid, phosphoric acid, acidic ion exchange resin and various types of Lewis acid), a catalyst of a base (for example, nitrogen-containing compounds such as ammonia, primary amines, secondary amines, tertiary amines and pyridine; basic ion exchange resin; hydroxides such as sodium hydroxide; carbonates such as potassium carbonate; carboxylates such as sodium acetate; and various types of Lewis base), or an alkoxide (for example, zirconium alkoxide, titanium alkoxide and aluminum alkoxide). For example, tri-i-propoxyaluminum may be used as an aluminum alkoxide. The amount of the catalyst used is preferably no greater than 0.2 mol, and more preferably 0.00001 to 0.1 mol relative to 1 mol of a monomer of a hydrolyzable silane compound in light of promotion of the hydrolytic condensation reaction.

The reaction temperature and the reaction time are appropriately set in the hydrolytic condensation. For example, the following conditions may be employed. The reaction temperature is preferably 40 to 200° C., and more preferably 50 to 150° C. The reaction time is preferably 30 minutes to 24 hours, and more preferably 1 to 12 hours. Such a reaction temperature and a reaction time enable the hydrolytic condensation reaction to be most efficiently carried out. In the hydrolytic condensation, the hydrolytic condensation reaction may be carried out in one step by adding a hydrolyzable silane compound, water and a catalyst in the reaction system at one time, or in a multiple step by adding a hydrolyzable silane compound, water and a catalyst in the reaction system at several times. It is to be noted that water and generated alcohol can be removed from the reaction system by adding a dehydrating agent, followed by subjecting the water and the generated alcohol to evaporation after the hydrolytic condensation reaction.

The content of the polysiloxane (A) is preferably no less than 80% by mass, more preferably no less than 90% by mass, and particularly preferably no less than 95% by mass with respect to the total solid content in the composition for forming a resist underlayer film. It is to be noted that the composition for forming a resist underlayer film may contain one type alone of the polysiloxane (A), or contain two or more types of the polysiloxane (A).

The polystyrene equivalent weight average molecular weight (Mw) of the polysiloxane (A) as determined on gel permeation chromatography (GPC) is typically 500 to 50,000, preferably 1,000 to 30,000, more preferably 1,000 to 15,000, and particularly preferably 1,000 to 5,000.

(B) Organic Solvent Composition

The organic solvent composition (B) includes (B1) an alkylene glycol monoalkyl ether acetate and (B2) an organic solvent. The content of the alkylene glycol monoalkyl ether acetate (B1) in the organic solvent composition (B) is no less than 50% by mass and no greater than 99% by mass, and the content of the organic solvent (B2) is no less than 1% by mass and no greater than 50% by mass. In addition, the organic solvent composition (B) may contain other component (organic solvent) such as an organic solvent (hereinafter, may be also referred to as "organic solvent (B3)") within a range not leading to impairment of the effects of the present invention. Each of the components may be used either alone or in combination of two or more types thereof. Hereinafter, each component will be explained in detail.

(B1) Alkylene Glycol Monoalkyl Ether Acetate

The alkylene glycol monoalkyl ether acetate (B1) is an organic solvent having a standard boiling point of less than 150.0° C. The alkylene glycol monoalkyl ether acetate (B1) is preferably a propylene glycol monoalkyl ether acetate. When the alkylene glycol monoalkyl ether acetate (B1) is a propylene glycol monoalkyl ether acetate, solubility of the polysiloxane (A) can be further improved.

Examples of the alkylene glycol monoalkyl ether acetate (B1) include ethylene glycol monoalkyl ethers such as ethylene glycol monomethyl ether acetate (boiling point: 145° C.); propylene glycol monoalkyl ether acetates such as propylene glycol monomethyl ether acetate (boiling point: 146° C.), and the like. Of these, propylene glycol monoalkyl ether acetates are preferred, and propylene glycol monomethyl ether acetate is more preferred.

The content of the alkylene glycol monoalkyl ether acetate (B1) in the organic solvent composition (B) is no less than 50% by mass and no greater than 99% by mass. The content is preferably no less than 70% by mass and no greater than 99% by mass, and more preferably no less than 80% by mass and no greater than 99% by mass. When the content of the alkylene glycol monoalkyl ether acetate (B1) falls within the above range, storage stability can be effectively improved and coating defects can be reduced.

(B2) Organic Solvent

The organic solvent (B2) is an organic solvent having a standard boiling point of no less than 150.0° C. Due to the organic solvent composition (B) including the organic solvent (B2) that is a component having a high boiling point, the composition can have superior storage stability by which film thickness alteration of the resist underlayer film accompanied by storage can be suppressed, and coating defects can be reduced in a resist underlayer film-forming process.

The standard boiling point of the organic solvent (B2) is preferably no less than 160° C., more preferably no less than 170° C., and still more preferably no less than 180° C. When the standard boiling point of the organic solvent (B2) falls within the above range, the storage stability of the composition can be more effectively improve and coating defects can be further reduced.

The standard boiling point of the organic solvent (B2) is preferably no greater than 300° C., more preferably no greater than 280° C., still more preferably no greater than 250° C., and particularly preferably no greater than 220° C. When the standard boiling point of the organic solvent (B2) falls within the above range, residues of the organic solvent after providing the resist underlayer film can be decreased.

Examples of the component of the organic solvent (B2) include esters, alcohols, ethers, ketones and amide solvents, and the like. Among these, an ester, an ether or a combination thereof is preferred, and a carboxylate ester, a lactone, a carbonate, the compound represented by the above formula (i) or a combination thereof is more preferred. When the organic solvent (B2) is the solvent s described above, the solubility of the polysiloxane (A) in the composition can be further improved.

In the above formula (i), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, wherein in a case where n is 2 or greater, a plurality of $R^3$s are optionally the same or different.

Examples of the alkyl group having 1 to 4 carbon atoms represented by the $R^1$ and $R^2$ include linear alkyl groups such as a methyl group, an ethyl group, a n-propyl group and a n-butyl group; branched alkyl groups such as an isopropyl group, an isobutyl group, a sec-butyl group and a t-butyl group, and the like.

Examples of the acyl group having 1 to 4 carbon atoms represented by the $R^1$ and $R^2$ include a formyl group, an acetyl group, a propionyl group, and the like.

Examples of the ester include:

carboxylic acid esters such as 3-methoxybutyl acetate (boiling point: 172° C.), 2-ethylbutyl acetate (boiling point: 160° C.), 2-ethylhexyl acetate (boiling point: 199° C.), benzyl acetate (boiling point: 212° C.), cyclohexyl acetate (boiling point: 172° C.), methylcyclohexyl acetate (boiling point: 201° C.), n-nonyl acetate (boiling point: 208° C.), methyl acetoacetate (boiling point: 169° C.), ethyl acetoacetate (boiling point: 181° C.), iso-amyl propionate (boiling point: 156° C.), diethyl oxalate (boiling point: 185° C.), di-n-butyl oxalate (boiling point: 239° C.), ethyl lactate (boiling point: 151° C.), n-butyl lactate (boiling point: 185° C.), diethyl malonate (boiling point: 199° C.) and dimethyl phthalate (boiling point: 283° C.);

lactones such as β-propiolactone (boiling point: 162° C.), γ-butyrolactone (boiling point: 204° C.), γ-valerolactone (boiling point: 207° C.) and γ-undecalactone (boiling point: 286° C.); and carbonates such as ethylene carbonate (boiling point: 244° C.) and propylene carbonate (boiling point: 242° C.)

Examples of the alcohol include:

monoalcohols such as 3-methoxybutanol (boiling point: 157° C.), n-hexanol (boiling point: 157° C.), n-octanol (boiling point: 194° C.), sec-octanol (boiling point: 174° C.), n-nonyl alcohol (boiling point: 215° C.), n-decanol (boiling point: 228° C.), phenol (boiling point: 182° C.), cyclohexanol (boiling point: 161° C.) and benzyl alcohol (boiling point: 205° C.);

polyhydric alcohols such as ethylene glycol (boiling point: 197° C.), 1,2-propylene glycol (boiling point: 188° C.), 1,3-butylene glycol (boiling point: 208° C.), 2,4-pentanediol (boiling point: 201° C.), 2-methyl-2,4-pentanediol (boiling point: 196° C.), 2,5-hexanediol (boiling point: 216° C.) and triethylene glycol (boiling point: 165° C.);

partially etherified polyhydric alcohols such as ethylene glycol monobutyl ether (boiling point: 171° C.), ethylene glycol monophenyl ether (boiling point: 244° C.), diethylene glycol monomethyl ether (boiling point: 194° C.), diethylene glycol monoethyl ether (boiling point: 202° C.), triethylene glycol monomethyl ether (boiling point: 249° C.), diethylene glycol monoisopropyl ether (boiling point: 207° C.), diethylene glycol monobutyl ether (boiling point: 231° C.), triethylene glycol monobutyl ether (boiling point: 271° C.), ethylene glycol monoisobutyl ether (boiling point: 161° C.), diethylene glycol monoisobutyl ether (boiling point: 220° C.), ethylene glycol monohexyl ether (boiling point: 208° C.), diethylene glycol monohexyl ether (boiling point: 259° C.), ethylene glycol mono 2-ethylhexyl ether (boiling point: 229° C.), diethylene glycol mono 2-ethylhexyl ether (boiling point: 272° C.), ethylene glycol monoallyl ether (boiling point: 159° C.), diethylene glycol monophenyl ether (boiling point: 283° C.), ethylene glycol monobenzyl ether (boiling point: 256° C.), diethylene glycol monobenzyl ether (boiling point: 302° C.), dipropylene glycol monomethyl ether (boiling point: 187° C.), tripropylene glycol monomethyl ether (boiling point: 242° C.), dipropylene glycol monopropyl ether (boiling point: 212° C.), propylene glycol monobutyl ether (boiling point: 170° C.), dipropylene glycol monobutyl ether (boiling point: 231° C.) and propylene glycol monophenyl ether (boiling point: 243° C.)

Examples of the ether include diethylene glycol dimethyl ether (boiling point: 162° C.), triethylene glycol dimethyl ether (boiling point: 216° C.), diethylene glycol methyl ethyl ether (boiling point: 176° C.), diethylene glycol diethyl ether (boiling point: 189° C.), diethylene glycol dibutyl ether (boiling point: 255° C.), dipropylene glycol dimethyl ether (boiling point: 171° C.), diethylene glycol monoethyl ether acetate (boiling point: 217° C.), ethylene glycol monobutyl ether acetate (boiling point: 188° C.), 1,8-cineole (boiling point: 176° C.), diisopentyl ether (boiling point: 171° C.), anisole (boiling point: 155° C.), ethyl benzyl ether (boiling point: 189° C.), diphenyl ether (boiling point: 259° C.), dibenzyl ether (boiling point: 297° C.), phenetole (boiling point: 170° C.), dihexyl ether (boiling point: 226° C.), and the like.

Examples of the ketone include ethyl amyl ketone (boiling point: 167° C.), dibutyl ketone (boiling point: 186° C.), diamyl ketone (boiling point: 228° C.), and the like.

Examples of the amide solvents include

N-methylpyrrolidone (boiling point: 204° C.), N,N-dimethylacetamide (boiling point: 165° C.), formamide (boiling point: 210° C.), N-ethylacetamide (boiling point: 206° C.), N-methylacetamide (boiling point: 206° C.), and the like.

Examples of the other the organic solvent (B2) include furfural (boiling point: 162° C.), dimethyl sulfoxide (boiling point: 189° C.), sulfolane (boiling point: 287° C.), glycerol (boiling point: 290° C.), succinonitrile (boiling point: 265° C.), nitrobenzene (boiling point: 211° C.), and the like.

The relative permittivity of the organic solvent (B2) is preferably 13 or greater and 200 or less, more preferably 15 or greater and 150 or less, and still more preferably 20 or greater and 100 or less. When the organic solvent (B2) has the relative permittivity falling within the above range, the composition can further improve the solubility of the polysiloxane (A).

Examples of the organic solvent (B2) having the relative permittivity falling within the above range include ethyl acetoacetate (relative permittivity: 16), N-methylpyrrolidone (relative permittivity: 33), N,N-dimethylacetamide (relative permittivity: 39), formamide (relative permittivity: 111), N-ethylacetamide (relative permittivity: 135), N-methylacetamide (relative permittivity: 179), furfural (relative permittivity: 42), propylene carbonate (relative permittivity: 63), ethylene carbonate (relative permittivity: 90), dimethyl sulfoxide (relative permittivity: 49), sulfolane (relative permittivity: 42), ethylene glycol (relative permittivity: 41), glycerol (relative permittivity: 47), succinonitrile (relative permittivity: 63), nitrobenzene (relative permittivity: 36), γ-butyrolactone (relative permittivity: 39), and the like.

The content of the organic solvent (B2) in the organic solvent composition (B) is no less than 1% by mass and no greater than 50% by mass. The content is preferably no less than 2% by mass and no greater than 40% by mass, and more preferably no less than 2% by mass and no greater than 30% by mass. When the content of the organic solvent (B2) falls within the above range, the storage stability can be more effectively improved and coating defects can be further reduced.

(B3) Organic Solvent

The organic solvent (B3) is an alcohol having a standard boiling point of less than 150.0° C. The composition for forming a resist underlayer film may contain the organic solvent (B3) within a range not leading to impairment of the effects of the present invention.

Examples of the organic solvent (B3) include:

monoalcohols such as methanol (boiling point: 65° C.), ethanol (boiling point: 78° C.), n-propanol (boiling point: 97° C.), iso-propanol (boiling point: 82° C.), n-butanol (boiling point: 117° C.), iso-butanol (boiling point: 108° C.), sec-butanol (boiling point: 99° C.), tert-butanol (boiling point: 82° C.), n-pentanol (boiling point: 138° C.), iso-pentanol (boiling point: 132° C.), 2-methylbutanol (boiling point: 136° C.), sec-pentanol (boiling point: 118° C.), tert-pentanol (boiling point: 102° C.), 2-methylpentanol (boiling point: 148° C.) and 2-ethylbutanol (boiling point: 146° C.); and partially etherified polyhydric alcohols such as ethylene glycol monomethyl ether (boiling point: 125° C.), ethylene glycol monoethyl ether (boiling point: 135° C.), propylene glycol-1-methyl ether (boiling point: 120° C.), propylene glycol-1-ethyl ether (boiling point: 133° C.) and propylene glycol-1-propyl ether (boiling point: 149.8° C.).

The content of the organic solvent (B3) in the organic solvent composition (B) is preferably no less than 0% by mass and no greater than 10% by mass, more preferably no less than 0% by mass and no greater than 5% by mass, still more preferably no less than 0% by mass and no greater than 3% by mass, and particularly preferably no less than 0% by mass and no greater than 0.5% by mass.

(C) Acid Diffusion Control Agent

The acid diffusion control agent (C) is a component that inhibits diffusion of an acid generated in a resist film upon exposure. When the composition for forming a resist underlayer film of the embodiment of the present invention further contains the acid diffusion control agent (C), diffusion of an acid in the resist film which may be caused via the resist underlayer film can be effectively inhibited while maintaining the effects described above. As a result, the shape of a resist pattern formed by a multilayer resist process can be improved. It is to be noted that the acid diffusion control agent (C) may be used either alone or in combination of two or more types thereof.

Examples of the acid diffusion control agent (C) include amine compounds, amide group-containing compounds, urea compounds, nitrogen-containing heterocyclic compounds, and the like.

Examples of the amine compound include: mono(cyclo)alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include: N-t-butoxycarbonyl group-containing amino compounds such as N-t-butoxycarbonyl-4-hydroxypiperidine, N-t-butoxycarbonyl-2-carboxy-4-hydroxypyrrolidine and N-t-butoxycarbonyl-2-carboxy-pyrrolidine; N-t-amyloxycarbonyl group-containing amino compounds such as N-t-amyloxycarbonyl-4-hydroxypiperidine; N-(9-anthranilmethyloxycarbonyl) group-containing amino compounds such as N-(9-anthranilmethyloxycarbonyl)piperidine; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include: pyridines; piperazines; pyrazine, pyrazole, pyridazine, quinoxaline, purine, pyrrolidine, piperidine, piperidine ethanol, 3-(N-piperidino)-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

Of these, an amide group-containing compound and a nitrogen-containing heterocyclic compound are preferred. The amide group-containing compound is more preferably an N-t-butoxycarbonyl group-containing amino compound, an N-t-amyloxycarbonyl group-containing amino compound and an N-(9-anthranilmethyloxycarbonyl) group-containing amino compound, and particularly preferably N-t-butoxycarbonyl-4-hydroxypiperidine, N-t-butoxycarbonyl-2-carboxy-4-hydroxypyrrolidine, N-t-butoxycarbonyl-2-carboxy-pyrrolidine, N-t-amyloxycarbonyl-4-hydroxypiperidine and N-(9-anthranilmethyloxycarbonyl)piperidine. Furthermore, the nitrogen-containing heterocyclic compound is more preferably 3-(N-piperidino)-1,2-propanediol.

Alternatively, a photodegradable base that generates a base through photosensitization upon exposure may be also used as the acid diffusion control agent (C). One exemplary photodegradable base is an onium salt compound that loses acid diffusion controllability through degradation upon exposure. Examples of the onium salt compound include sulfonium salt compounds represented by the following formula (2-1), iodonium salt compounds represented by the following formula (2-2), and the like.

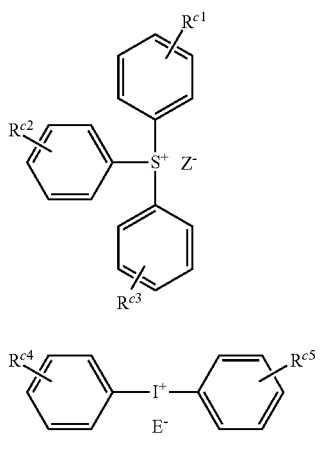

(2-1)

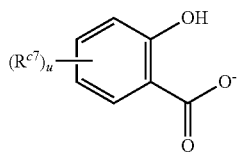

(2-2)

In the above formulae (2-1) and (2-2), $R^{c1}$ to $R^{c5}$ each independently represent a hydrogen atom, an alkyl group, an alkoxy group, a hydroxy group or a halogen atom; $Z^-$ and $E^-$ each independently represent $OH^-$, $R^{c6}$—$COO^-$ or $R^{c6}$—$SO_3^-$; $R^{c6}$ represents an alkyl group, an aryl group, an alkaryl group or an anion represented by the following formula (2').

(2')

In the above formula (2'), $R^{c7}$ represents a linear or branched alkyl group having 1 to 12 carbon atoms or a linear or branched alkoxy group having 1 to 12 carbon atoms, wherein a part or all of hydrogen atoms included in the alkyl group and the alkoxy group are not substituted or optionally substituted by a fluorine atom; and u is an integer of 0 to 2.

Examples of the alkyl group represented by $R^{c1}$ to $R^{c7}$ include a methyl group, an ethyl group, a n-propyl group, an i-propyl group, an n-butyl group, an i-butyl group, a t-butyl group, and the like.

Examples of the alkoxy group represented by $R^{c1}$ to $R^{c5}$ and $R^{c7}$ include a methoxy group, an ethoxy group, a t-butoxy group, and the like.

Examples of the halogen atom represented by $R^{c1}$ to $R^{c5}$ include a fluorine atom, a chlorine atom, a bromine atom, an iodine atom, and the like.

Examples of the aryl group represented by $R^{c6}$ include a phenyl group, a naphthyl group, an anthryl group, and the like.

Examples of the alkaryl group represented by $R^{c6}$ include a benzyl group, a phenethyl group, a phenylpropyl group, and the like.

The photodegradable base is exemplified by compounds represented by the following formulae, and the like.

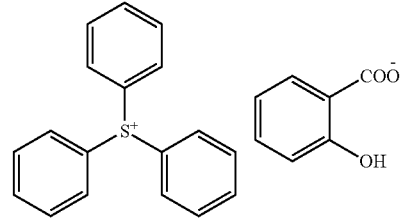

(2-1-1)

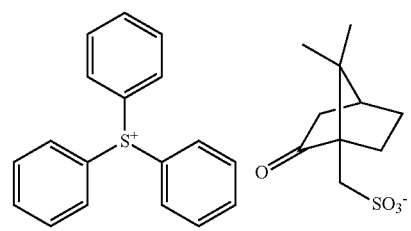

(2-1-2)

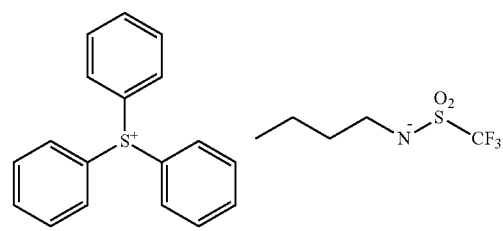

(2-1-3)

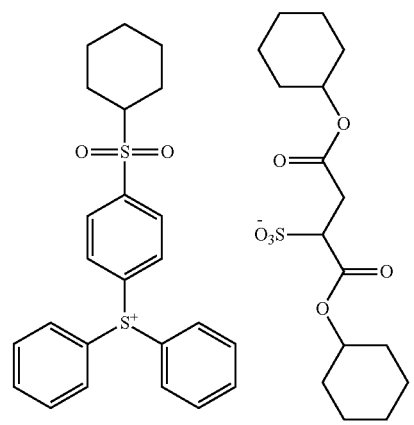

(2-1-4)

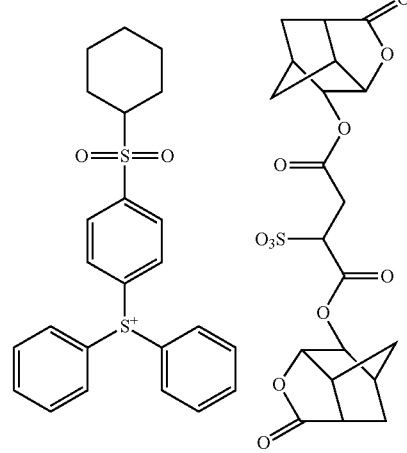

(2-1-5)

-continued (2-1-6)

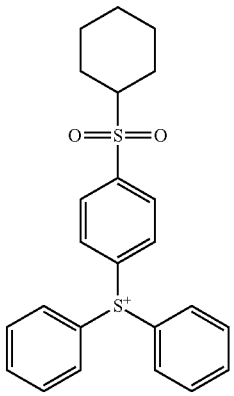 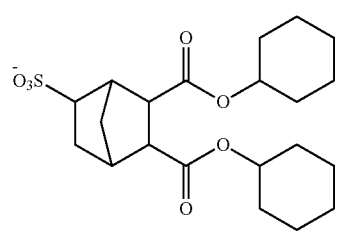

Of these, triphenylsulfonium salicylate represented by the formula (2-1-1), triphenylsulfonium 10-camphorsulfonate represented by the formula (2-1-2), and triphenylsulfonium N-butyltrifluoromethylsulfonamide represented by the formula (2-1-3) are preferred.

The content of the acid diffusion control agent (C) with respect to 100 parts by mass of the polysiloxane (A) is preferably 0.1 parts by mass to 10 parts by mass, and more preferably 1 part by mass to 5 parts by mass. When the content of the acid diffusion control agent (C) falls within the above range, a resist underlayer film having high etching selectivity with respect to the resist film can be provided, and the shape of the resist pattern can be improved.

Other Optional Components

The composition for forming a resist underlayer film of the embodiment of the present invention may contain other optional components such as water, colloidal silica, colloidal alumina, an organic polymer and a surfactant as long as the effects of the present invention are not impaired. The other optional components may be each used either alone or in combination of two or more types thereof. Moreover, the content of the other optional component may be appropriately selected in accordance with the purpose therefor.

(D) Water

The water (D) is a component which may be contained in the composition for forming a resist underlayer film. When the composition for forming a resist underlayer film contains water, storage stability of the composition can be improved. The water is preferably distilled water, ultra pure water, or deionized water.

The content of the water (D) with respect to 100 parts by mass of the polysiloxane (A) is preferably no less than 1 part by mass and no greater than 1,000 parts by mass, more preferably no less than 5 parts by mass and no greater than 500 parts by mass, and still more preferably no less than 10 parts by mass and no greater than 200 parts by mass. When the content of the water (D) falls within the above range, the storage stability can be effectively improved.

Organic Polymer

Examples of the organic polymer include polymers of an acrylate compound, a methacrylate compound, or an aromatic vinyl compounds; vinylamide polymers, dendrimers, polyimides, polyamic acids, polyarylenes, polyamides, polyquinoxalines, polyoxadiazoles, fluorine polymers, and the like.

Surfactant

The surfactant is exemplified by a nonionic surfactant, an anionic surfactant, a cationic surfactant, an amphoteric surfactant, a silicone surfactant, a polyalkyleneoxide surfactant, a fluorine-containing surfactant, and the like.

Preparation Method of Composition for Forming a Resist Underlayer Film

The composition for forming a resist underlayer film of the embodiment of the present invention may be prepared by mixing the polysiloxane (A) and the organic solvent composition (B), and as needed the acid diffusion control agent (C) and the other optional component(s), etc., at a predetermined ratio.

Pattern-Forming Method

The pattern-forming method of the embodiment of the present invention includes the steps of:

(1) providing a resist underlayer film on a substrate to be processed using the composition for forming a resist underlayer film;

(2) providing a resist film on the resist underlayer film using a resist composition;

(3) exposing the resist film by irradiation with an exposure light through a photomask;

(4) developing the exposed resist film to form a resist pattern; and (5) sequentially dry-etching the resist underlayer film and the substrate to be processed using the resist pattern as a mask.

According to the pattern-forming method of the embodiment of the present invention, since the composition for forming a resist underlayer film has the properties described in the foregoing, a resist pattern having a favorable shape can be formed.

Step (1)

In this step, a resist underlayer film is provided on a substrate to be processed using the composition for forming a resist underlayer film. Examples of the substrate to be processed include a silicon wafer, a wafer coated with aluminum, and the like.

With respect to a method for providing the resist underlayer film, for example, a coated film of the composition for forming a resist underlayer film may be provided by coating on the surface of a substrate to be processed and/or other underlayer film described later, etc., and the coated film may be subjected to a heat treatment, or both irradiation with an ultraviolet ray and a heat treatment to allow for hardening, whereby the resist underlayer film can be provided. The method for coating the composition for forming a resist underlayer film is exemplified by a spin-coating method, a roll coating method, a dipping method, and the like. In addition, the heating temperature is typically 50° C. to 450° C., and preferably 150° C. to 300° C. The heating time period is typically 5 sec to 600 sec.

It is to be noted that the substrate to be processed may be provided beforehand with other underlayer film that is different from the resist underlayer film provided using the composition for forming a resist underlayer film of the embodiment of the present invention (hereinafter, may be also referred to as "other underlayer film"). The other underlayer film is exemplified by organic antireflective films disclosed in Japanese Examined Patent Application, Publication No. H6-12452 and Japanese Unexamined Patent Application, Publication No. S59-93448, etc., and the like.

The film thickness of the resist underlayer film is typically 10 nm to 1,000 nm, and preferably 10 nm to 500 nm.

Step (2)

In this step, a resist film is provided on the resist underlayer film using a resist composition. Specifically, after coating the resist composition such that the resultant resist film has a predetermined film thickness, the solvent in the coated film is volatilized by prebaking to provide the resist film.

The resist composition is exemplified by a positive or negative chemically amplified type resist composition containing an acid generating agent, a positive type resist composition constituted with an alkali-soluble resin and a quinone diazide based photosensitizing agent, a negative type resist composition constituted with an alkali-soluble resin and a crosslinking agent, and the like.

The total solid content of the resist composition is typically 1% by mass to 50% by mass. In addition, the resist composition is generally employed for providing the resist film after filtering through a filter having a pore size of about 0.2 µm, for example. It is to be noted that a commercially available resist composition may be used as is in this step.

The coating method of the resist composition is not particularly limited, and for example, a spin coating method or the like may be employed. In addition, the temperature of the prebaking may be appropriately adjusted according to the type and the like of the resist composition used, but is usually 30° C. to 200° C., and preferably 50° C. to 150° C.

Step (3)

In this step, the resist film is exposed by irradiation with an exposure light through a photomask. The exposure light is appropriately selected in accordance with the type of the photoacid generating agent used in the resist composition from among visible light rays, ultraviolet rays, far ultraviolet rays, X-rays and the like. Of these, far ultraviolet rays are preferred; a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm), an extreme ultraviolet ray (wavelength: 13 nm, etc.) are more preferred; and an ArKr excimer laser beam (wavelength: 134 nm) is particularly preferred.

After the exposure, post-baking may be carried out for improving resolution, pattern profile, developability, and the like. The temperature of the post-baking is appropriately adjusted in accordance with the type of the resist composition used, which is typically 50° C. to 200° C., and preferably 70° C. to 150° C.

Step (4)

In this step, the exposed resist film is developed to form a resist pattern. The developer solution for use in this step is appropriately selected in accordance with the type of the resist composition used. Examples of the developer solution include alkaline aqueous solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethyl ethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like. An appropriate amount of a water-soluble organic solvent, for example, an alcohol such as methanol or ethanol, and a surfactant, etc., may be optionally added to these alkaline aqueous solutions.

After the development with the aforementioned developer, the resist film is washed and dried to form a predetermined resist pattern.

Step (5)

In this step, the resist underlayer film and the substrate to be processed are sequentially dry-etched using the resist pattern as a mask. The dry etching may be effected using any well-known dry etching apparatus. In addition, depending on the elemental composition of the object to be etched, oxygen atom-containing gases such as $O_2$, CO, and $CO_2$, inert gases such as He, $N_2$, and Ar, chlorine based gases such as $Cl_2$ and $BCl_4$, fluorine based gases such as $CHF_3$ and $CF_4$, other gases such as $H_2$ and $NH_3$ can be used as a source gas in the dry etching. It is to be noted that these gases may also be used in mixture.

In addition, the pattern-forming method may include a step of removing a resist underlayer film remaining on the substrate to be processed after these processes. It is to be noted that the resist pattern may be formed by a nanoimprinting or the like, without undergoing a step of the development.

EXAMPLES

Hereinafter, the present invention will be explained more specifically by way of Examples, but the present invention is not limited thereto. Measurements of the solid content concentration and the polystyrene equivalent weight average molecular weight (Mw) of a polysiloxane were conducted according to the following method.

Solid Content Concentration of Polysiloxane

A solution containing a polysiloxane in an amount of 0.5 g was baked at 250° C. for 30 min, and the mass of the resulting solid content was measured to determine the solid content concentration (% by mass) of the polysiloxane.

Polystyrene Equivalent Weight Average Molecular Weight (Mw)

The polystyrene equivalent weight average molecular weight (Mw) was determined by gel permeation chromatography (GPC) using GPC columns (G2000HXL×2; G3000HXL×1; and G4000HXL×1, manufactured by Tosoh Corporation) under an analytical condition involving a flow rate of 1.0 mL/min and a column temperature of 40° C. with tetrahydrofuran as an elution solvent, with mono-dispersed polystyrene as a standard.

Synthesis of Polysiloxane (A)

The polysiloxane (A) was synthesized using the following silane compounds.

M-1: tetramethoxysilane
M-2: phenyltrimethoxysilane
M-3: 4-methylphenyltrimethoxysilane
M-4: methyltrimethoxysilane Synthesis Example 1

An aqueous oxalic acid solution was prepared by dissolving 1.28 g of oxalic acid in 12.85 g of water with heating. Thereafter, a flask charged with 25.05 g of M-1 (90 mol %), 3.63 g of M-2 (10 mol %) and 43.21 g of methanol was fitted with a condenser and a dropping funnel containing the aqueous oxalic acid solution. Next, after heating the flask to 60° C. in an oil bath, the aqueous oxalic acid solution was slowly added dropwise to permit a reaction at 60° C. for 4 hrs. After completion of the reaction, the flask containing the reaction solution was allowed to cool, and 129.00 g of propylene glycol monomethyl ether acetate was added to the reaction solution and fitted with an evaporator. The remaining water and methanol generated were removed to obtain 86.0 g of a solution containing (A-1) a polysiloxane as a solid matter. The solid content concentration of the polysiloxane (A-1) in the solution was 18.0% by mass, and the Mw of the polysiloxane (A-1) was 2,000.

Synthesis Example 2

Tetramethylammonium hydroxide in an amount of 2.92 g was dissolved in 8.75 g of water with heating to prepare an aqueous tetramethylammonium hydroxide solution. Thereafter, a flask charged with 11.67 g of the aqueous tetramethylammonium hydroxide solution, 4.53 g of water and 20 g of methanol was fitted with a condenser and a dropping funnel containing a methanol solution consisting of 10.66 g of M-1 (70 mol %), 2.12 g of M-3 (10 mol %), 2.72 g of M-4 (20 mol %) and 20 g of methanol. Next, after heating the flask to 50° C. in an oil bath, the methanol solution was slowly added dropwise, and the mixture was reacted at 50° C. for 2 hrs. After completion of the reaction, the flask containing the reaction solution was allowed to cool.

Thereafter, the reaction solution cooled as described above was added dropwise to 36.67 g of a solution of maleic acid in methanol prepared separately by dissolving 4.39 g of maleic anhydride in 16.14 g of water and 16.14 g of methanol, and the mixture was stirred for 30 min. Next, after adding 50 g of 4-methyl-2-pentenone, the flask was fitted with an evaporator, and the remaining water, the reaction solvent and methanol generated during the reaction were removed to obtain a solution of a 4-methyl-2-pentenone resin. The resin solution was transferred to a separating funnel, and then 80 g of water was added thereto to carry out first washing, followed by second washing carried out by adding 40 g of water thereto. Thereafter, to the solution of the 4-methyl-2-pentenone resin transferred from the separating funnel to the flask was added 50 g of propylene glycol monomethyl ether acetate. The flask was then fitted with an evaporator to remove 4-methyl-2-pentenone, whereby 51 g of a propylene glycol monomethyl ether acetate solution containing (A-2) a polysiloxane as a solid matter was obtained. The solid content concentration of the polysiloxane (A-2) in the solution was 14.5% by mass, and the Mw of the resultant polysiloxane (A-2) was 4,000.

Synthesis Examples 3 to 5

Solutions containing polysiloxanes (A-3) to (A-5), respectively, were synthesized in a similar manner to Synthesis Example 1 except that each monomer that gives the polysiloxane (A) was used in amounts shown in Table 1. It is to be noted that the solid content concentration of the polysiloxane (A) in the solution containing each of the obtained polysiloxane (A) and the Mw of the polysiloxane (A) are shown in Table 1.

Synthesis Example 6

An aqueous oxalic acid solution was prepared by dissolving 1.28 g of oxalic acid in 12.85 g of water with heating. Thereafter, a flask charged with 25.05 g of M-1 (90 mol %), 3.63 g of M-2 (10 mol %) and 57.19 g of propylene glycol-1-ethyl ether was fitted with a condenser and a dropping funnel containing the aqueous oxalic acid solution. Next, after heating the flask to 60° C. in an oil bath, the aqueous oxalic acid solution was slowly added dropwise to permit a reaction at 60° C. for 4 hrs. After completion of the reaction, the flask containing the reaction solution was allowed to cool, and then fitted with an evaporator. The remaining water and methanol generated were removed to obtain 97.3 g of a solution containing (A-6) a polysiloxane as a solid matter. The solid content concentration of the polysiloxane (A-6) in the solution was 18.0% by mass, and the Mw of the polysiloxane (A-6) was 2,000.

TABLE 1

| (A) Polysiloxane | Monomer that gives (A) polysiloxane type | using amount (mol %) | Solid content concentration (% by mass) | Mw |
|---|---|---|---|---|
| Synthesis Example 1 | A-1 | M-1<br>M-2 | 90<br>10 | 18.0 | 2,000 |
| Synthesis Example 2 | A-2 | M-1<br>M-3<br>M-4 | 70<br>10<br>20 | 14.5 | 4,000 |
| Synthesis Example 3 | A-3 | M-1<br>M-2<br>M-4 | 75<br>10<br>15 | 18.5 | 2,000 |
| Synthesis Example 4 | A-4 | M-1<br>M-3<br>M-4 | 80<br>5<br>15 | 16.7 | 1,900 |
| Synthesis Example 5 | A-5 | M-1<br>M-2<br>M-3<br>M-4 | 80<br>3<br>5<br>12 | 16.2 | 1,900 |
| Synthesis Example 6 | A-6 | M-1<br>M-2 | 90<br>10 | 18.0 | 2,000 |

Preparation of Composition for Forming a Resist Underlayer Film

Each component other than the polysiloxane (A) is shown below.
(B) Organic Solvent Composition
  (B1) Component
  B1-1: propylene glycol monomethyl ether acetate
  (B2) Organic solvent
  B2-1: ethyl acetoacetate
  (standard boiling point: 180.8° C.; relative permittivity: 15.9)
  B2-2: γ-butyrolactone
  (standard boiling point: 204° C.; relative permittivity: 39)
  B2-3: dimethyl sulfoxide
  (standard boiling point: 189.0° C.; relative permittivity: 48.9)
  (B3) Component
  B3-1: propylene glycol-1-methyl ether
  (standard boiling point: 120° C.)
  B3-2: propylene glycol-1-ethyl ether
  (standard boiling point: 133° C.)
  B3-3: propylene glycol-1-propyl ether
  (standard boiling point: 149.8° C.)
(C) Acid Diffusion Control Agent
  Compounds represented by the following formulae (C-1) to (C-6)

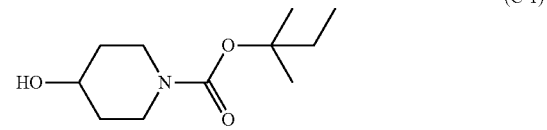

(C-1)

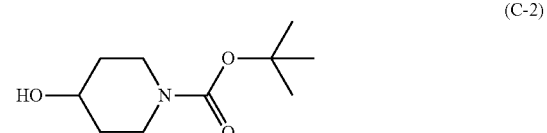

(C-2)

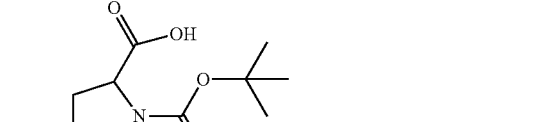

(C-3)

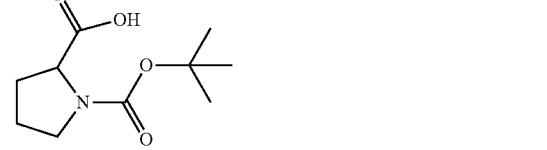

(C-4)

-continued

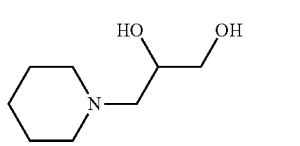
(C-5)

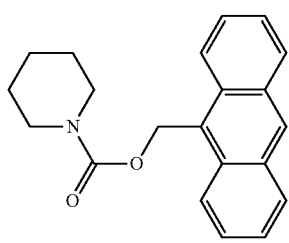
(C-6)

(D) Water
D-1: distilled water

Example 1

A composition for forming a resist underlayer film was prepared by blending 2.01 parts by mass of A-1 as the polysiloxane (A), 68.56 parts by mass of B1-1 as the alkylene glycol monoalkyl ether acetate (B1), 29.38 parts by mass of B2-1 as the organic solvent (B2), and 0.05 parts by mass of C-1 as the acid diffusion control agent (C).

Examples 2 to 16, and Comparative Examples 1 to 3

Each composition for forming a resist underlayer film was prepared in a similar manner to Example 1 except that the type and the amount of each component blended were as shown in Table 2. It is to be noted that "-" in Table 2 denotes that the corresponding component was not blended.

Evaluations

Each of the prepared compositions for forming a resist underlayer film was evaluated on storage stability, initial coating defects and coating defects after storage according to the following method. The results of the evaluations are shown in Table 3.

Evaluation of Initial Coating Defects

Each composition for forming a resist underlayer film immediately after the preparation was coated on a silicon wafer by a spin coating method using a coater/developer (CLEAN TRACK ACT12, manufactured by Tokyo Electron Limited), and the coated film obtained was dried at 220° C. for 60 sec, followed by cooling to 23° C. to provide a coated film having a film thickness of 30 nm. Thereafter, coating defects were determined using a surface defect inspection device (KLA2800, manufactured by KLA Tencor), and the determined results were defined for an evaluation of initial coating defects. In these regards, the initial coating defects were evaluated as: favorable "A" when the number of coating defects was no greater than 100; and unfavorable "B" when the number of coating defects exceeded 100.

Storage Stability

Each composition for forming a resist underlayer film immediately after the preparation was coated on a silicon wafer by a spin coating method using the coater/developer described above, and the coated film obtained was dried at 215° C. for 1 min, followed by cooling to 23° C. The film thickness of the resist underlayer films after the cooling was 30 nm when measured using a film thickness measuring device (M-2000D, manufactured by J. A. Woollam). The film thickness thus measured is defined as "initial film thickness" (T0).

Next, after each of the prepared compositions for forming a resist underlayer film was stored at 35° C. for 30 days, resist underlayer films were provided and the film thickness was measured by a method similar to the aforementioned method

TABLE 2

| | (A) Component | | (B1) Component | | (B2) Organic solvent | | (B3) Organic solvent | | (C) Acid diffusion control agent | | (D) Water | |
|---|---|---|---|---|---|---|---|---|---|---|---|---|
| | type | amount blended (parts by mass) | type | amount blended (parts by mass) | type | amount blended (parts by mass) | type | amount blended (parts by mass) | type | amount blended (parts by mass) | type | amount blended (parts by mass) |
| Example 1 | A-1 | 2.01 | B1-1 | 68.56 | B2-1 | 29.38 | — | — | C-1 | 0.05 | — | — |
| Example 2 | A-1 | 1.93 | B1-1 | 93.11 | B2-2 | 4.90 | — | — | C-1 | 0.06 | — | — |
| Example 3 | A-1 | 1.95 | B1-1 | 78.40 | B2-3 | 19.60 | — | — | C-1 | 0.05 | — | — |
| Example 4 | A-1 | 2.10 | B1-1 | 91.00 | B2-1 | 6.85 | — | — | C-2 | 0.05 | — | — |
| Example 5 | A-2 | 2.35 | B1-1 | 58.58 | B2-1 | 39.05 | — | — | C-4 | 0.02 | — | — |
| Example 6 | A-2 | 2.30 | B1-1 | 83.04 | B2-3 | 14.65 | — | — | C-6 | 0.01 | — | — |
| Example 7 | A-3 | 1.78 | B1-1 | 73.14 | B2-2 | 18.29 | B3-1 | 6.74 | C-2 | 0.05 | — | — |
| Example 8 | A-3 | 1.84 | B1-1 | 91.26 | B2-3 | 6.87 | — | — | C-3 | 0.03 | — | — |
| Example 9 | A-4 | 1.96 | B1-1 | 93.08 | B2-2 | 4.90 | — | — | C-1 | 0.06 | — | — |
| Example 10 | A-4 | 1.83 | B1-1 | 60.87 | B2-3 | 32.78 | B3-3 | 4.50 | C-5 | 0.02 | — | — |
| Example 11 | A-5 | 2.04 | B1-1 | 68.56 | B2-1 | 29.38 | — | — | C-2 | 0.02 | — | — |
| Example 12 | A-5 | 1.94 | B1-1 | 58.80 | B2-2 | 39.20 | — | — | C-1 | 0.06 | — | — |
| Example 13 | A-1 | 2.01 | B1-1 | 68.21 | B2-1 | 29.23 | — | — | C-1 | 0.05 | D-1 | 0.50 |
| Example 14 | A-1 | 1.93 | B1-1 | 92.16 | B2-2 | 4.85 | — | — | C-1 | 0.06 | D-1 | 1.00 |
| Example 15 | A-3 | 1.78 | B1-1 | 72.40 | B2-2 | 18.10 | B3-1 | 6.67 | C-2 | 0.05 | D-1 | 1.00 |
| Example 16 | A-4 | 1.83 | B1-1 | 59.01 | B2-3 | 31.78 | B3-3 | 4.36 | C-5 | 0.02 | D-1 | 3.00 |
| Comparative Example 1 | A-1 | 2.21 | B1-1 | 97.74 | — | — | — | — | C-1 | 0.05 | — | — |
| Comparative Example 2 | A-6 | 1.75 | B1-1 | 68.74 | — | — | B3-2 | 29.46 | C-1 | 0.05 | — | — |
| Comparative Example 3 | A-3 | 2.10 | B1-1 | 23.94 | B2-2 | 3.99 | B3-2 | 24.87 | — | — | — | — | using each composition after the storage. The film thickness thus measured is defined as "film thicknesses after storage" (T).

Then, the rate of change of the film thickness after the storage ($|T-T0|/T0\times100(\%)$) was calculated, and the calculated value was evaluated for storage stability. In these regards, the storage stability was evaluated as: very favorable "AA" when the calculated value was no greater than 2%; favorable "A" when the calculated value was greater than 2% and no greater than 5%; and unfavorable "B" when the calculated value was greater than 5%.

Evaluation of Coating Defects after Storage

After each composition for forming a resist underlayer film prepared was stored at 40° C. for one week, coating defects of the resist underlayer films were determined by a similar method to that shown in the "Evaluation of Initial Coating Defects" using each composition for forming a resist underlayer film after the storage. The results of the determination were defined as evaluation of coating defects after storage. In these regards, the coating defects after storage were evaluated as: favorable "A" when the number of coating defects was no greater than 100; and unfavorable "B" when the number of coating defects exceeded 100.

TABLE 3

| | Evaluation of initial coating defects | Storage stability | Evaluation of coating defects after storage |
|---|---|---|---|
| Example 1 | A | AA | A |
| Example 2 | A | AA | A |
| Example 3 | A | AA | A |
| Example 4 | A | AA | A |
| Example 5 | A | AA | A |
| Example 6 | A | AA | A |
| Example 7 | A | A | A |
| Example 8 | A | AA | A |
| Example 9 | A | AA | A |
| Example 10 | A | A | A |
| Example 11 | A | AA | A |
| Example 12 | A | AA | A |
| Example 13 | A | AA | A |
| Example 14 | A | AA | A |
| Example 15 | A | AA | A |
| Example 16 | A | AA | A |
| Comparative Example 1 | A | AA | B |
| Comparative Example 2 | B | B | B |
| Comparative Example 3 | A | B | A |

As is seen from the results shown in Table 3, in Examples, storage stability, and evaluations of initial coating defects and coating defects after storage were all favorable. To the contrary, in Comparative Examples, any of the evaluation items was unfavorable.

According to the embodiment of the present invention, a composition for forming a resist underlayer film having superior storage stability, and being capable of reducing generation of coating defects can be provided. Therefore, the composition for forming a resist underlayer film and a pattern-forming method can be suitably used in manufacturing processes of semiconductor devices in which miniaturization of patterns has been in progress.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
    providing a resist underlayer film on a substrate using a resist underlayer film composition;
    providing a resist film on the resist underlayer film using a resist composition;
    exposing the resist film by irradiation with an exposure light through a photomask;
    developing the exposed resist film to form a resist pattern; and
    sequentially dry-etching the resist underlayer film and the substrate using the resist pattern as a mask,
    wherein the resist underlayer film composition comprises:
    a polysiloxane;
    an acid diffusion control agent; and
    an organic solvent composition comprising:
        an alkylene glycol monoalkyl ether acetate having a standard boiling point of less than 150.0° C.; and
        an organic solvent which is an ester, an ether or a combination thereof and which has a standard boiling point of no less than 180° C.,
    wherein in the organic solvent composition, a content of the alkylene glycol monoalkyl ether acetate is no less than 50% by mass and no greater than 99% by mass, and a content of the organic solvent is no less than 1% by mass and no greater than 50% by mass.

2. The pattern-forming method according to claim 1, wherein the organic solvent is a carboxylate ester, a lactone, a carbonate, a compound represented by formula (1), or a combination thereof:

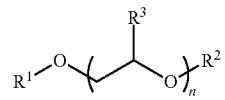

(1)

wherein, in the formula (1), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, wherein in a case where n is 2 or greater, a plurality of $R^3$s are each a same or different.

3. The pattern-forming method according to claim 1, wherein a relative permittivity of the organic solvent is 13 or greater and 200 or less.

4. The pattern-forming method according to claim 1, wherein the alkylene glycol monoalkyl ether acetate is a propylene glycol monoalkyl ether acetate.

5. The pattern-forming method according to claim 1, wherein the polysiloxane is a hydrolytic condensate of a compound comprising a silane compound represented by formula (i):

(i)

wherein, in the formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms of the alkyl group represented by $R^A$ are not substituted or substituted by an epoxyalkyloxy group, an epoxy group, an acid anhydride group or a cyano group, and a part or all of hydrogen atoms of the aryl group represented by $R^A$ are not substituted or substituted by a hydroxy group; X represents a halogen atom or $-OR^B$, wherein $R^B$ represents a monovalent organic group; a is an integer of 0 to 3, wherein in a case where $R^A$ and X are each present in a plurality of number, a plurality of $R^A$s are each a same or different and a plurality of Xs are each a same or different.

6. The pattern-forming method according to claim 1, wherein the organic solvent has a standard boiling point of no greater than 220° C.

7. The pattern-forming method according to claim 1, wherein the content of the organic solvent is no less than 2% by mass and no greater than 30% by mass.

8. The pattern-forming method according to claim 1, wherein a relative permittivity of the organic solvent is 20 or greater and 100 or less.

9. The pattern-forming method according to claim 1, wherein the content of the alkylene glycol monoalkyl ether acetate is no less than 80% by mass and no greater than 99%.

10. The pattern-forming method according to claim 1, wherein the organic solvent composition further comprises an alcohol having a standard boiling point of less than 150.0° C.

11. The pattern-forming method according to claim 10, wherein a content of the alcohol is no greater than 10% by mass.

12. The pattern-forming method according to claim 10, wherein the acid diffusion control agent includes an amide group-containing compound.

\* \* \* \* \*